(12) United States Patent
Goyal et al.

(10) Patent No.: US 7,838,426 B2
(45) Date of Patent: Nov. 23, 2010

(54) MASK TRIMMING

(75) Inventors: Supriya Goyal, Emeryville, CA (US); Dongho Heo, Fremont, CA (US); Jisoo Kim, Pleasanton, CA (US); S.M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 629 days.

(21) Appl. No.: 11/841,189

(22) Filed: Aug. 20, 2007

(65) Prior Publication Data

US 2009/0050271 A1    Feb. 26, 2009

(51) Int. Cl.
 *H01L 21/311* (2006.01)
(52) U.S. Cl. .................. 438/694; 216/47
(58) Field of Classification Search .......... 216/41, 216/47; 438/725, 694
See application file for complete search history.

(56) References Cited

U.S. PATENT DOCUMENTS

| | | | |
|---|---|---|---|
| 4,707,218 A | 11/1987 | Giammarco et al. | |
| 6,150,678 A | 11/2000 | Tung et al. | |
| 6,599,437 B2 * | 7/2003 | Yauw et al. | 216/47 |
| 6,632,741 B1 | 10/2003 | Clevenger et al. | |
| 6,787,459 B2 | 9/2004 | Moniwa et al. | |
| 7,014,956 B2 | 3/2006 | Chen et al. | |
| 7,081,407 B2 | 7/2006 | Annapragada et al. | |
| 2004/0224520 A1 | 11/2004 | Yun et al. | |
| 2007/0075038 A1 | 4/2007 | Sadjadi et al. | |

FOREIGN PATENT DOCUMENTS

| | | |
|---|---|---|
| EP | 0933802 A1 | 8/1999 |
| EP | 1191582 A1 | 3/2002 |

OTHER PUBLICATIONS

Search Report dated Jan. 30, 2009 from International Application No. PCT/US2008/07362.
Witten Opinion dated Jan. 30, 2009 from International Application No. PCT/US2008/07362.
Lam Research Corporation, "Lam Research Corporation's 2300® Motif™ Post-lithography Pattern Enhancement System Breaks Advanced Lithography Barrier", http://biz.yahoo.com/bw/070619/20070619006161.html?.v=1, Jun. 19, 2007.

* cited by examiner

*Primary Examiner*—Roberts Culbert
(74) *Attorney, Agent, or Firm*—Beyer Law Group LLP

(57) ABSTRACT

A method for etching a dielectric layer is provided. A patterned mask with mask features is formed over a dielectric layer. The mask has isolated areas and dense areas of the mask features. The mask is trimmed by a plurality of cycles, where each cycle includes depositing a deposition layer, and selectively etching the deposition layer and the patterned mask. The selective etching selectively trims the isolated areas of the mask with respect to the dense areas of the mask. The dielectric layer is etched using the thus trimmed mask. The mask is removed.

16 Claims, 10 Drawing Sheets

MASK TRIMMING

BACKGROUND OF THE INVENTION

The present invention relates to the formation of semiconductor devices. More specifically, the present invention relates to etching process for dielectric layers.

During semiconductor wafer processing, features of the semiconductor device are defined in the wafer using well-known patterning and etching processes. In these processes (photolithography), a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Argon-fluoride (ArF) excimer laser having wavelength of 193 nm (ArF lithography technology) has been used to for the production of sub 0.04 µm devices. This immersion lithography technology enables processes below the 110 nm node. Such small features in most highly integrated circuits require higher resolution and thus a thinner photoresist because of the depth-of-focus (depth-of-field) limitations of the patterning image. For example, the ArF lithography for certain DRAM processes, such as Bitline, uses a very thin photoresist with a thickness less than 100 nm. The photoresist material is also softer and weak, and such a thin photoresist would easily and undesirably be etched during a plasma etching process for one or more antireflective coating (ARC) layers, such as the bottom antireflective coating (BARC) and silicon oxynitride (SiON) layers, after patterning of the photoresist. Thus, it has been one of the major challenges in the short-wavelength lithography to manage the "etch budget" and prevent surface degradation of the photoresist, while achieving target critical dimensions (CD). Here, "etch budget" is typically the amount of time during which an exposed structure (the photoresist in this case) can be subjected to etchant without undue damages.

In addition, an ideal etching process must accurately transfer the pattern on the mask to an underlying layer to be etched. However, since the etching process removes a target material both chemically and physically, the etching process is very sensitive to various environmental parameters. One of such factors in conventional etching control is the micro-loading effect, in which the characteristics of the etching differ under the variation of size and density of the pattern (feature), i.e., the variation of the "loading", of a layer to be etched (an etch layer).

SUMMARY OF THE INVENTION

To achieve the foregoing and in accordance with the purpose of the present invention a method for etching a dielectric layer is provided. A patterned mask with mask features is formed over a dielectric layer. The mask has isolated areas and dense areas of the mask features. The mask is trimmed by a plurality of cycles, where each cycle includes depositing a deposition layer and selectively etching the deposition layer and the patterned mask. The selective etching selectively trims the isolated areas of the mask with respect to the dense areas of the mask. The dielectric layer is etched using the thus trimmed mask.

In another manifestation of the invention an apparatus for etching a dielectric layer formed below a patterned mask with mask features is provided. The mask has isolated areas and dense areas of the mask features. The apparatus is provided with a plasma processing chamber which includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet, where the gas source comprises a mask-trimming deposition gas source, a mask-trimming etch gas source, and a dielectric layer (etch layer) etch gas source. A controller is controllably connected to the gas source and at least one electrode. The controller includes at least one processor and computer readable media. The computer readable media comprises computer readable code for trimming the mask including a plurality of cycles, wherein the computer readable code for each cycle comprises computer readable code for providing a deposition gas from the mask-trimming deposition gas source, computer readable code for generating a plasma from the deposition gas, computer readable code for stopping the deposition gas from the mask-trimming deposition gas source, computer readable code for providing an etch gas from the mask-trimming etch gas source, computer readable code for generating a plasma from the mask-trimming etch gas, and computer readable code for stopping the mask-trimming etch gas from the mask-trimming etch gas source. The computer readable media further comprises computer readable code for etching the dielectric layer and computer readable code for removing the mask (and any antireflection layers).

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
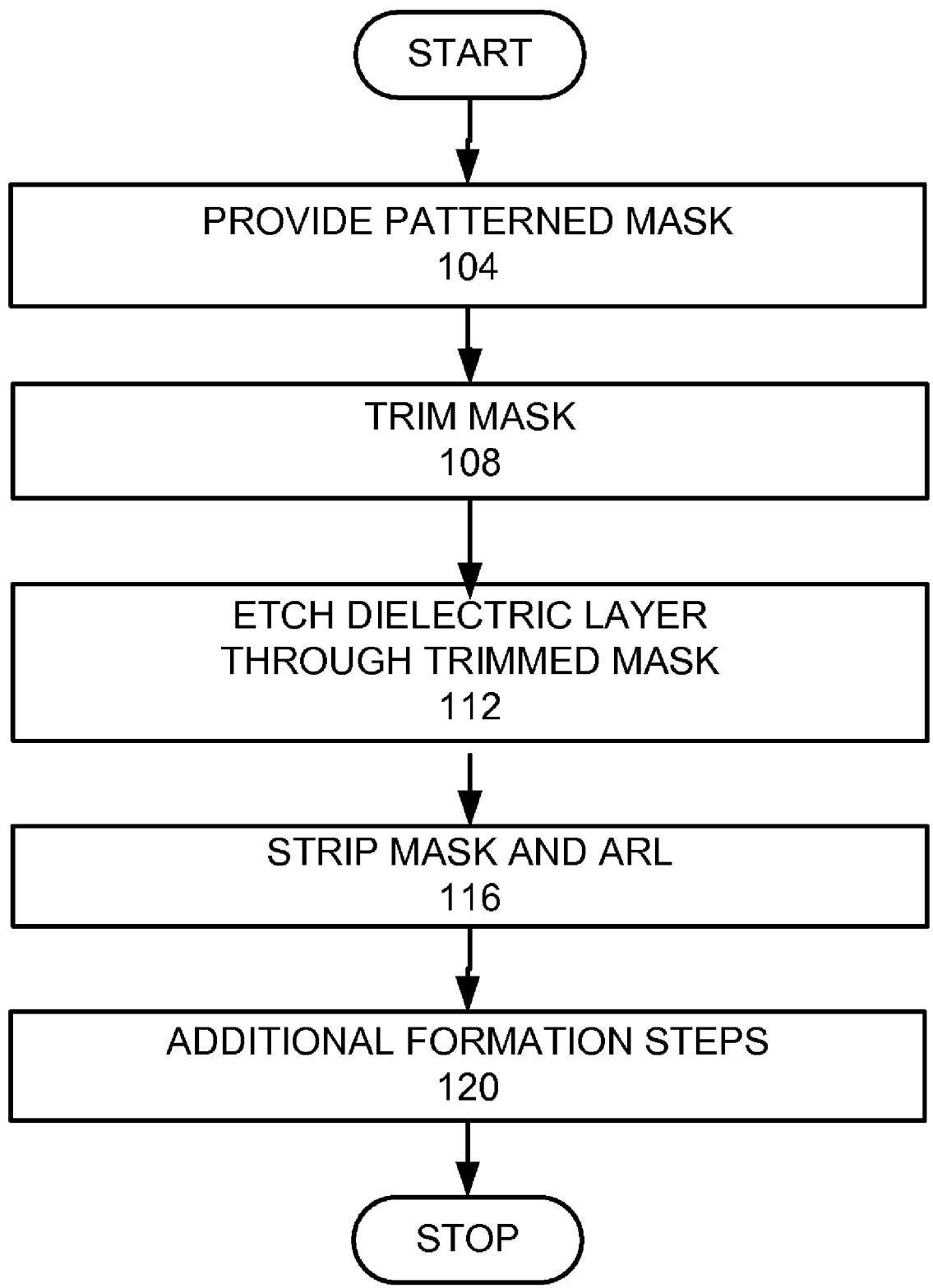
FIG. 1 is a high level flow chart of a process that may be used in an embodiment of the invention.
Figure 2A:
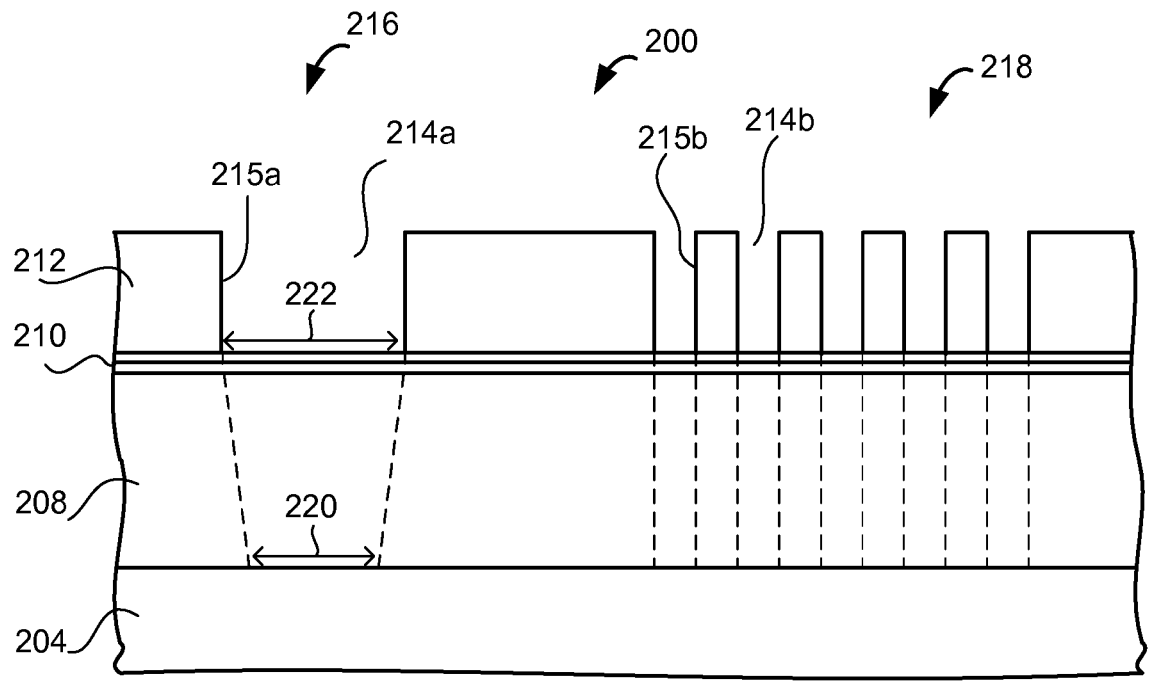
FIGS. 2A-D are schematic cross-sectional views of a stack processed according to an embodiment of the invention.

To facilitate understanding, FIG. 1 is a high level flow chart of a process that may be used in an embodiment of the invention. A patterned mask is provided (step 104) over a dielectric layer which is to be patterned. For example, the dielectric layer may be a nitride oxide layer, and the mask may be a photoresist mask. FIG. 2A is a schematic cross-sectional view of the dielectric layer 208 to be etched that is formed over a substrate 204, an antireflective layer (ARL) 210 formed over the dielectric layer 208, and a patterned photoresist mask 212 with a feature 214 that is formed over the ARL 210, forming a stack 200. The ARL 210 may include a bottom antireflective coating (BARC) layer and a dielectric antireflective coating (DARC) layer.

The mask layer 212 is patterned to form mask features 214 (214a, 214b) with mask feature sidewalls 215a, 215b. As shown in FIG. 2A, the patterned mask 212 includes isolated areas 216 and dense areas 218 of the mask features. The isolated areas 216 typically include a smaller number of larger mask features, and the dense areas 218 typically include a larger numbers of smaller mask features. For example, the ratio of the CD of the mask features in the dense areas 128 and that in the isolated areas 126 may be 1:2 to 1:10. That is, the isolated areas 216 are also characterized as areas having large features 214a while the dense areas 218 as areas having small features 214b.

Figure 2B:
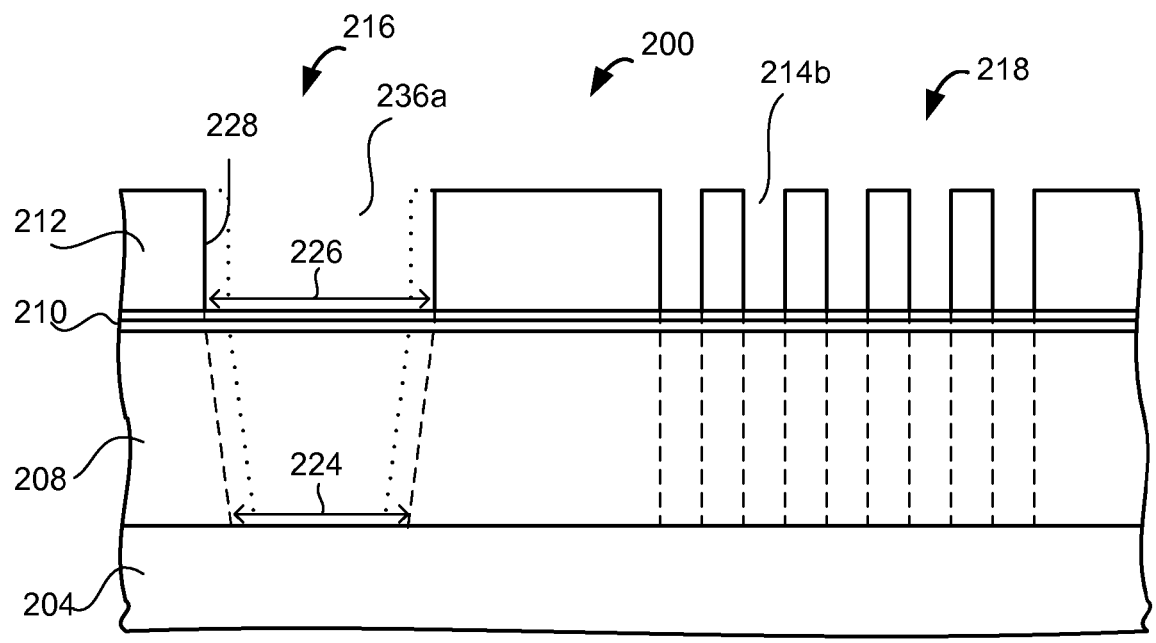

In the isolated areas 216, etching of the dielectric layer 208 tends to slow down, and, as a result, the final CD 220 of the feature, such as a trench, of the layer 208 is smaller than the original CD 222 of the mask feature 214a. Accordingly, in accordance with one embodiment of the present invention, the mask layer 212 is pre-treated such that the sidewall 228 is trimmed (step 108 in FIG. 1) such that the CD 226 of the mask features is enlarged in the isolated areas 216, while the mask features in the dense areas 218 and the thickness of the mask layer 212 in both of the isolated areas 216 and the dense areas 218 are substantially preserved, as shown in FIGS. 2A and 2B. Using the trimmed feature 236a, the final CD 224 of the dielectric layer 208 (in FIG. 2B) would be substantially the same as the original CD 222 of the original mask feature 124a (in FIG. 2A).

Figure 3:
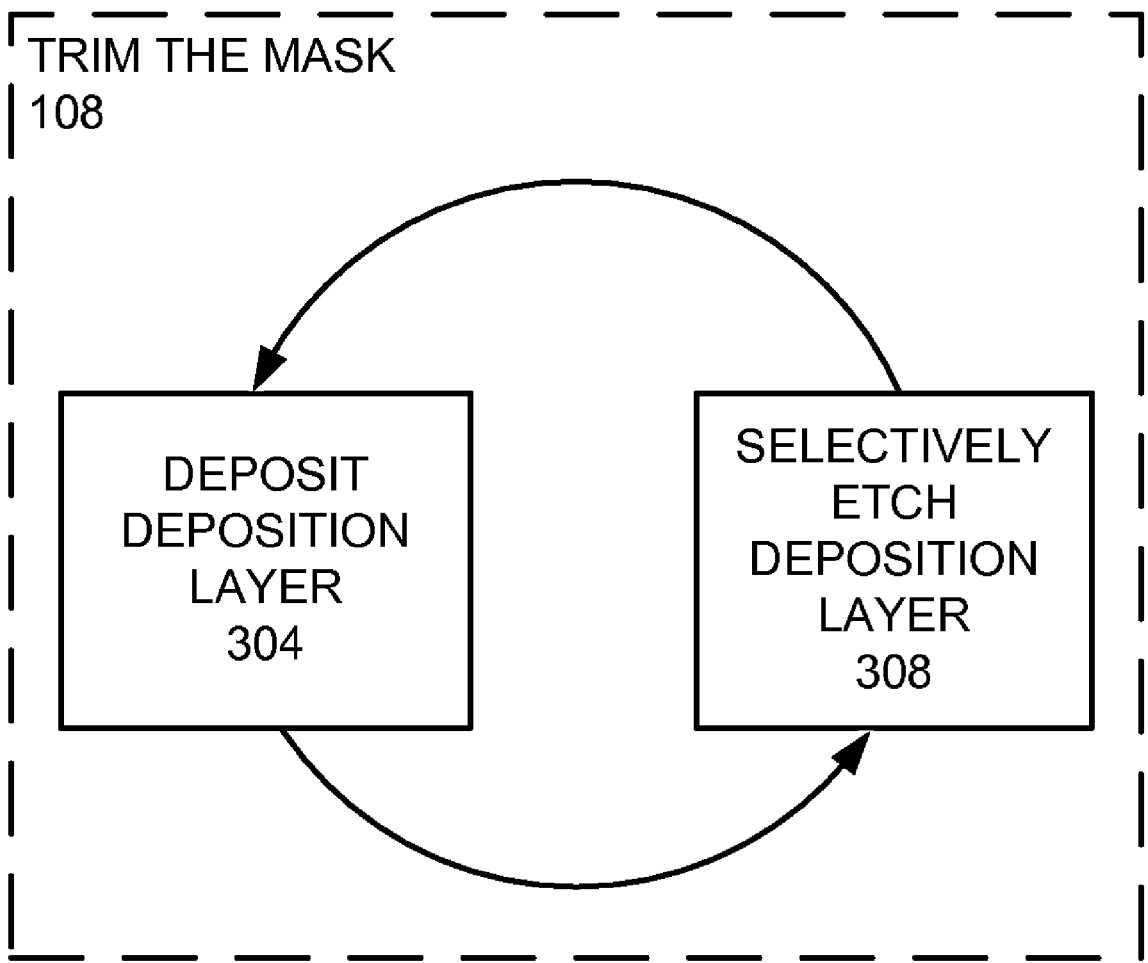
FIG. 3 is a more detailed flow chart of the step of trimming the mask in accordance with an embodiment of the present invention.

FIG. 3 is a more detailed process flow chart of the multi-cycle process for trimming a mask (step 108 in FIG. 1). In this example, the trimming of the mask is performed in a plurality of two-phase cycles. The first phase of each cycle is the deposition of a deposition layer on the sidewalls (step 304) and the second phase is selective etching of the deposition layer and the patterned mask. In this selective etching, the isolated areas 216 of the mask are selectively etched with respect to the dense areas 218. Additional phases may be added to each cycle. Preferably, this step is preformed at least 3 cycles. More preferably, this step is performed over 4 to 5 cycles.

Figure 4A:
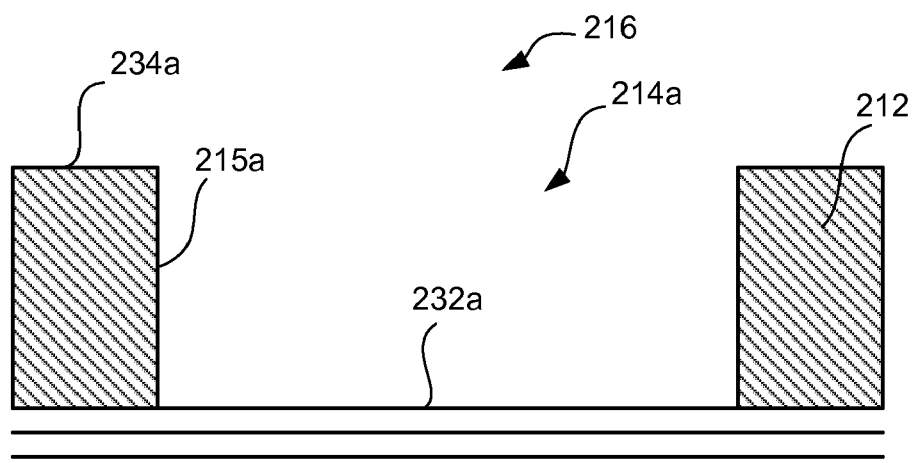
FIGS. 4A-C are schematic cross-sectional views of a mask feature in isolated areas (a large mask feature) processed according to an example of the invention.
Figure 4B:
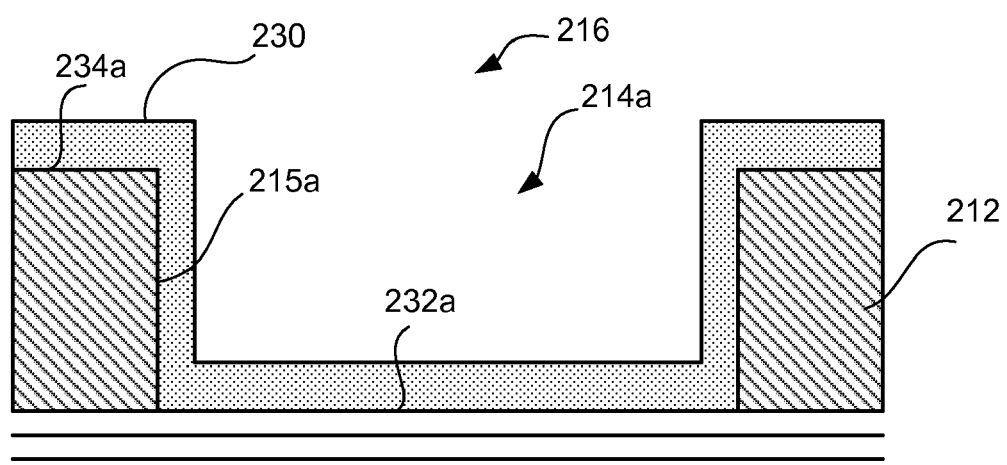
Figure 4C:
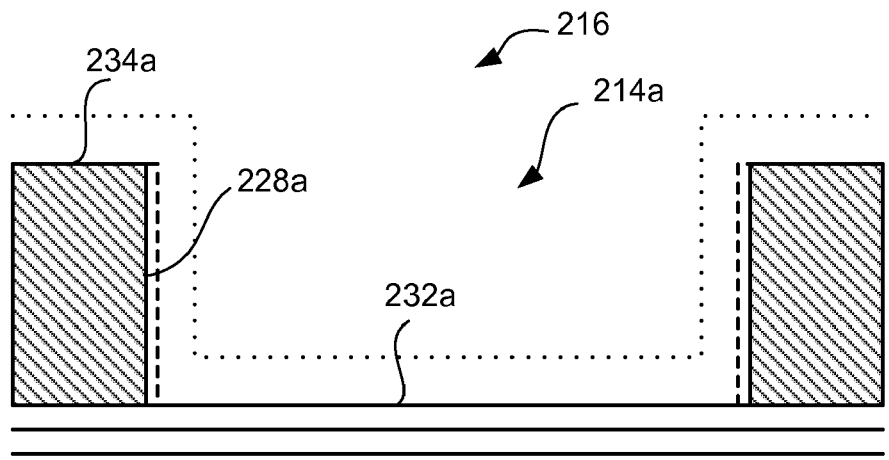
Figure 5A:
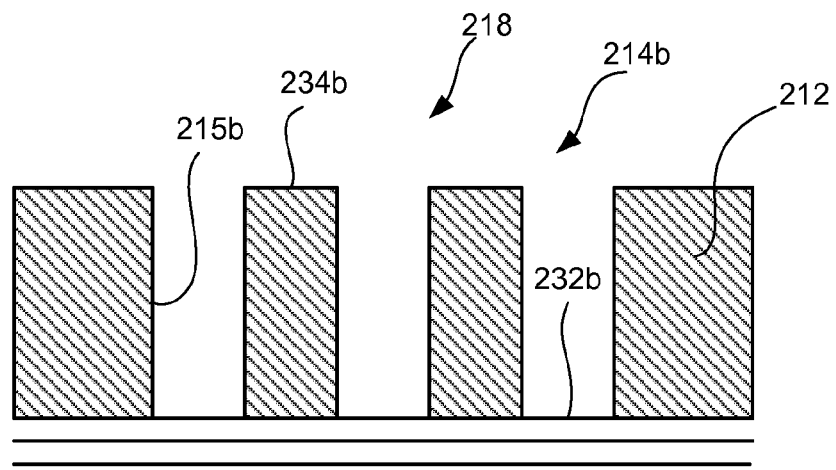
FIGS. 5A-C are schematic cross-sectional views of mask features in dense areas (small mask features) processed according to the example of the invention corresponding to FIGS. 4A-C.
Figure 5B:
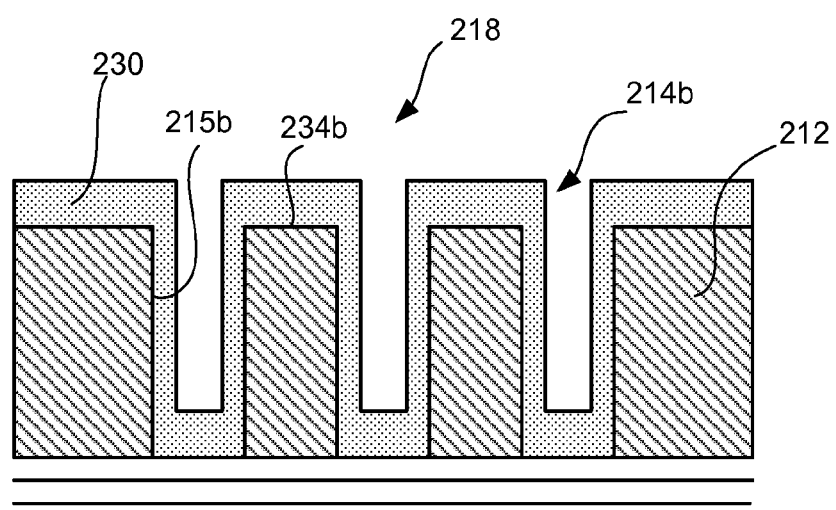
Figure 5C:
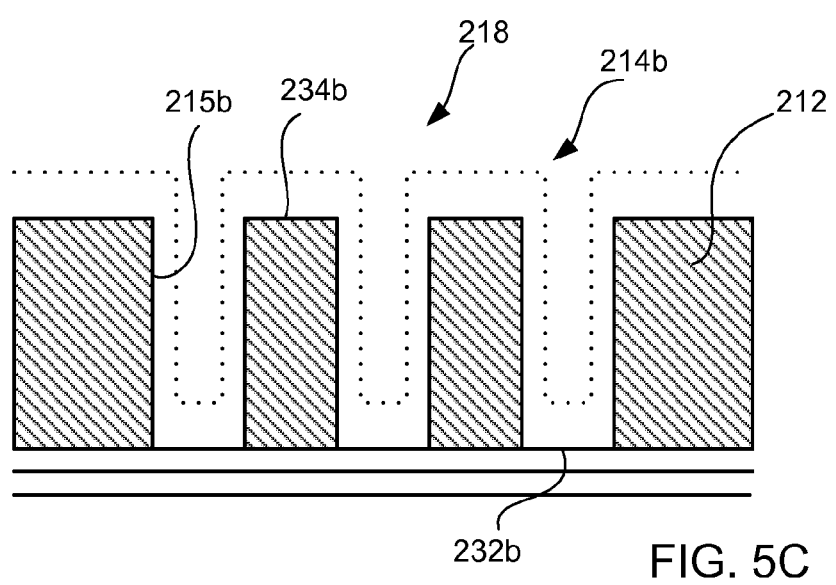

In accordance with one embodiment of the present invention, the mask is a photoresist (PR), and the deposition phase (step 304) uses a deposition gas comprising a hydrocarbon component. Preferably, the deposition gas comprises $C_2H_4$. More preferably, the deposition gas further comprises a carrier gas, such as $N_2$ The selective etch phase (step 308) uses an etch gas comprising $O_2$ FIGS. 4A-4C schematically illustrates a cross sectional view of a mask feature 214a in the isolated areas 216 in each cycle of the trimming step. Similarly, FIGS. 5A-5C schematically illustrates a cross sectional view of mask features 214b in the dense areas 218 in each cycle of the trimming step. As shown in FIGS. 4A and 5A, the patterned mask 212 is formed over the dielectric layer 208. Typically, an ARL 210 is provided on the top of the dielectric layer 208 (i.e., on the bottom of the mask 212 and mask features 214). A deposition layer 230 is deposited over the mask 212, covering the bottoms 232a and 232b of the mask features 214a, 214b as well as the sidewalls 215a and 215b of the mask features 214a, 214b, as shown in FIGS. 4B and 5B. The deposition layer may be a polymer.

In each deposition phase, in general, the thickness of the deposition layer 230 deposited on the top of the mask and the thickness of the deposition layer 230 deposited on the bottom of the mask features are greater than the thickness of the deposition layer deposited on the sidewall of the mask features. In general, the deposition layer in the isolated area 216 is thicker than the deposition layer in the dense area 218, and the deposition gas deposits more deposition material onto the sidewall 215a of mask features in the isolated areas 216 than the sidewall 214b of the mask features in the dense areas 218. That is, the thickness of the deposition layer 230 deposited on a sidewall 215a of the mask 212 in the isolated areas 216 is greater than a thickness of the deposition layer that deposited in the dense area 218.

In each selective etch phase, in general, the selective etch gas etches (isotropic chemical etch) the deposition layer more in the isolated areas 216 than in the dense areas 218. Since this micro-loading effect in the etch process is more dominant than that in the deposition process, the thicker deposition layer on the sidewalls of the mask features in the isolated areas 216 can still be removed faster than the thinner deposition layer on the sidewalls in the dense areas 218. Within the isolated areas 216, since the deposition layer is thinner on the sidewalls than on the top of the mask and the bottom of the mask features, the sidewall deposition is over etched into the sidewall of the mask features. Accordingly, by controlling the two phases in the trimming step, the sidewalls of the mask features in the isolated areas 216 are selectively trimmed with respect to the dense areas 218. For the top of the mask and the bottom of the mask features, the selective etch phase removes only the deposition layer deposited in the previous deposition phase (making even), and does not etch the mask 212 or the ARL 210.

FIG. 4C schematically illustrates a cross sectional view of a mask feature 214a in the isolated areas 216 (large mask features) at the end of the selective etch phase, i.e., the end of one cycle of the trimming step. In the selective etch phase, the sidewall 215a of the mask 212 in the isolated areas 216 is etched back after the deposition layer 230 thereon is removed.

However, the deposition layer 230 on the bottom 232a of the mask feature 214a is removed without etching the dielectric layer (or the ARL) thereunder. The deposition layer 230 on the top 234a of the mask 212 is also substantially removed in the selective etch phase. As a result, the sidewall 215a of the mask feature 214a in the isolated area is trimmed down to enlarge the CD thereof, while the thickness of the mask 212 is substantially preserved in each cycle.

On the other hand, in the dense area 218, the selective etch phase substantially removes the deposition layer 230 on the sidewall 215b without etching back the sidewall 215 of the mask 212, as shown in FIG. 5C. In addition, the deposition layer 230 on the bottom 232b of the mask features 214b and on the top 234b of the mask 212 is also removed without etching the respective underlying layers (dielectric layer (or the ARL), or the mask 212) in the dense areas 218. As a result, in the dense area 218, the original thickness of the mask 212 and the original profile of the mask feature 214b are substantially preserved in each cycle.

Figure 6:
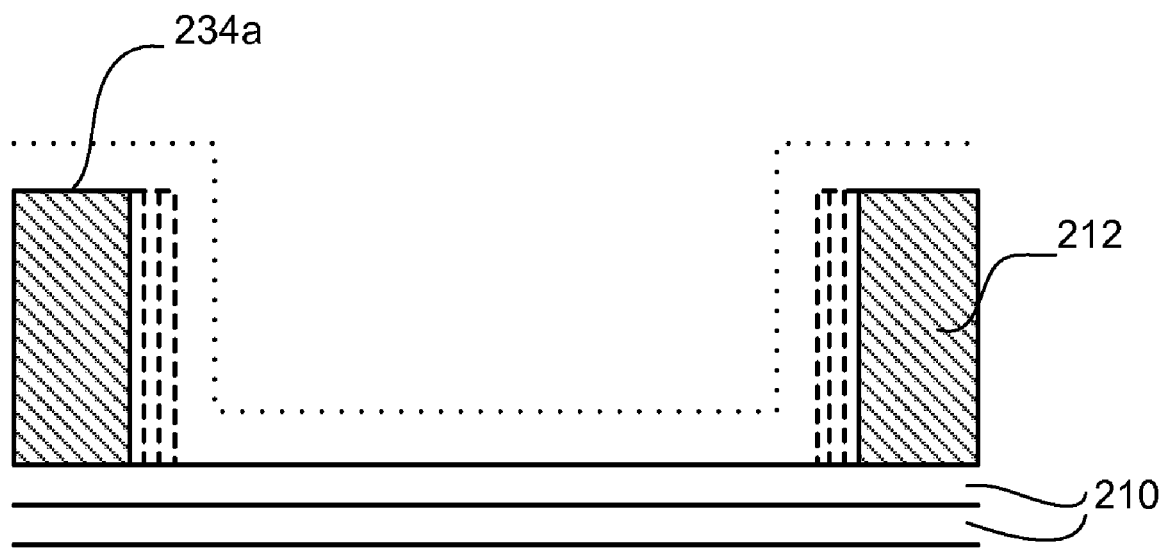
FIG. 6 is a schematic cross-sectional view of the mask feature in the isolated areas (a large mask feature) after a plurality of cycles of the trimming step.
Figure 7A:
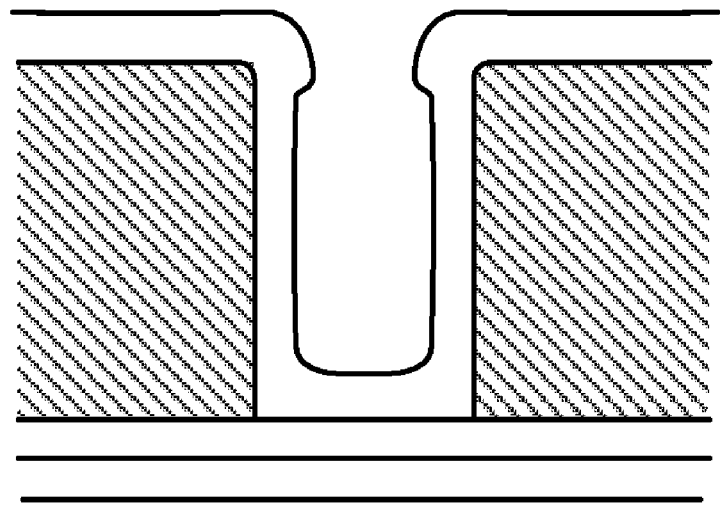
FIGS. 7A-B are schematic cross-sectional views of a mask feature having a bread-loafed profile and a faceted profile, respectively.
Figure 7B:
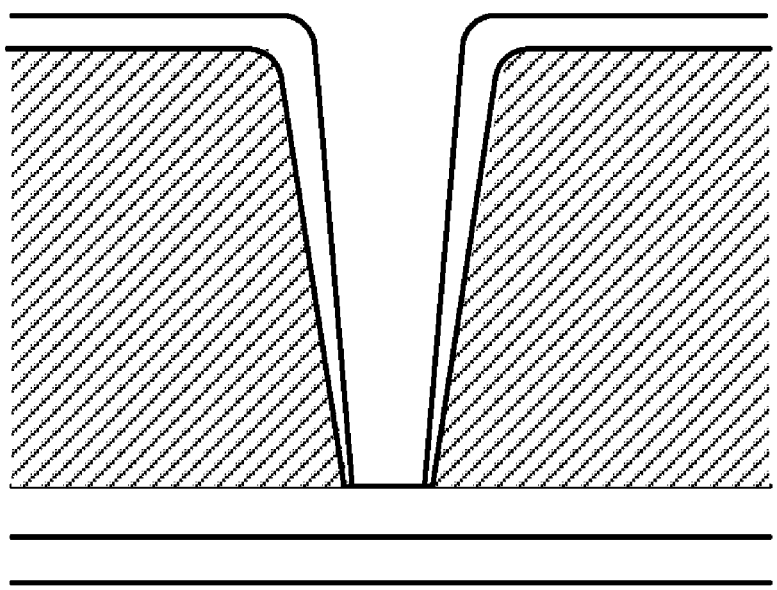

FIG. 6 schematically illustrates a cross sectional view of the mask feature 214a in the isolated areas 216 after a plurality of cycles of the trimming step. By repeating the deposition phase and the selective etch phase, the sidewalls of the mask features in the isolated area are trimmed little by little down to a desired profile. It should be noted that repeating a plurality of cycles by depositing a thin deposition layer and trimming a small amount of sidewalls in each cycle (multi-cycle process) has several advantages over depositing a thick deposition layer at a time and trim a large amount of the sidewall. First, the multi-cycle process provides better profile tuning. A single long deposition step to deposit a thicker polymer layer tends to produce a so called "bread-loaf" profile (as shown in FIG. 7A) and in extreme cases the feature may even be pinched off. On the other hand, a single long etch step would produce a faceted profile (as shown in FIG. 7B). A plurality of cycles of alternating deposition step and etching step gives better profile control with minimal or no bread-loafing and straighter side walls. In addition, the polymer layer becomes densified, minimizing delamination, striation, or blistering (peeling-off). For example, a thick deposition layer more than 1000 Å tends to peel off from the mask especially at the edge of the mask features. In addition, it should be noted that it is not desirable or practical to change the CD of the original mask due to the requirement of the design rule.

Figure 2C:
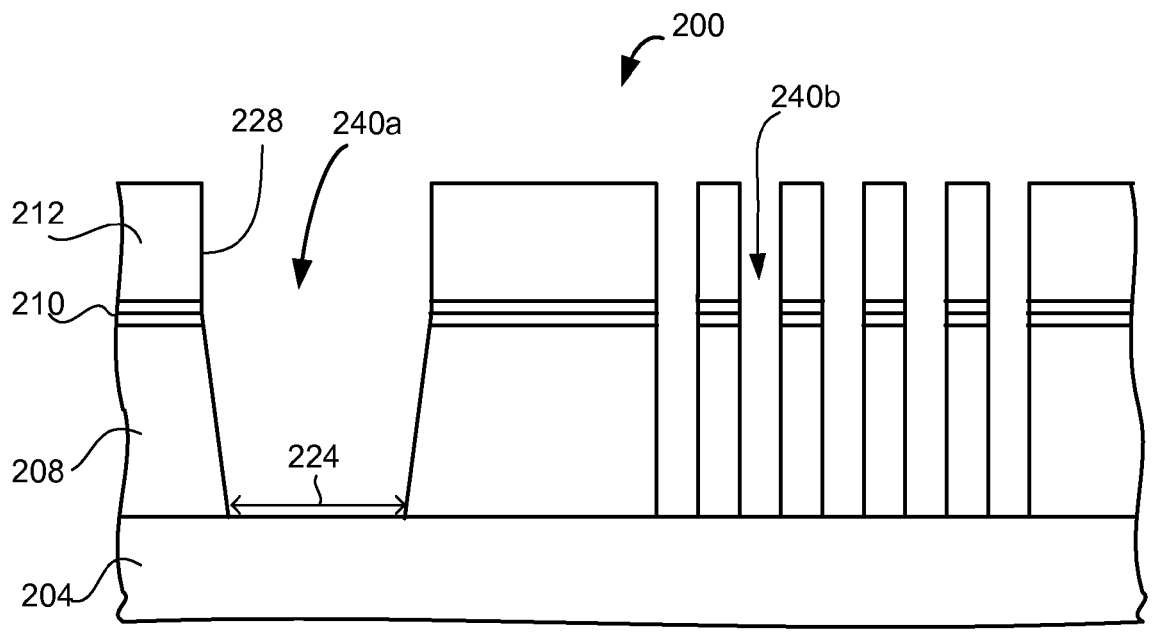

Returning to FIG. 1, after the trimming of the mask, features are etched into the dielectric layer 208 through the trimmed mask (step 112). FIG. 2C shows features 240 (240a, 240b) etched into the dielectric layer 208.

Figure 2D:
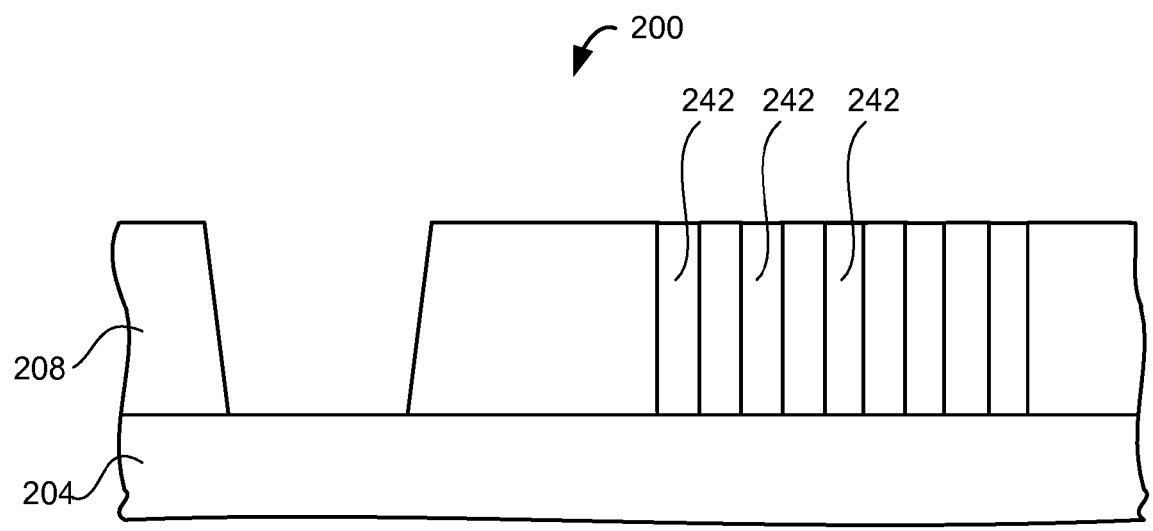

Returning to FIG. 1, the mask 212 and the ARL 210 are then stripped (step 116). FIG. 2D shows the stack 200 after the mask 212 and the ARL 210 have been removed. Additional formation steps may be performed (step 124). For example, contacts 242 may then be formed in the features. Additional processes may be performed after the contact is formed.

Figure 8:
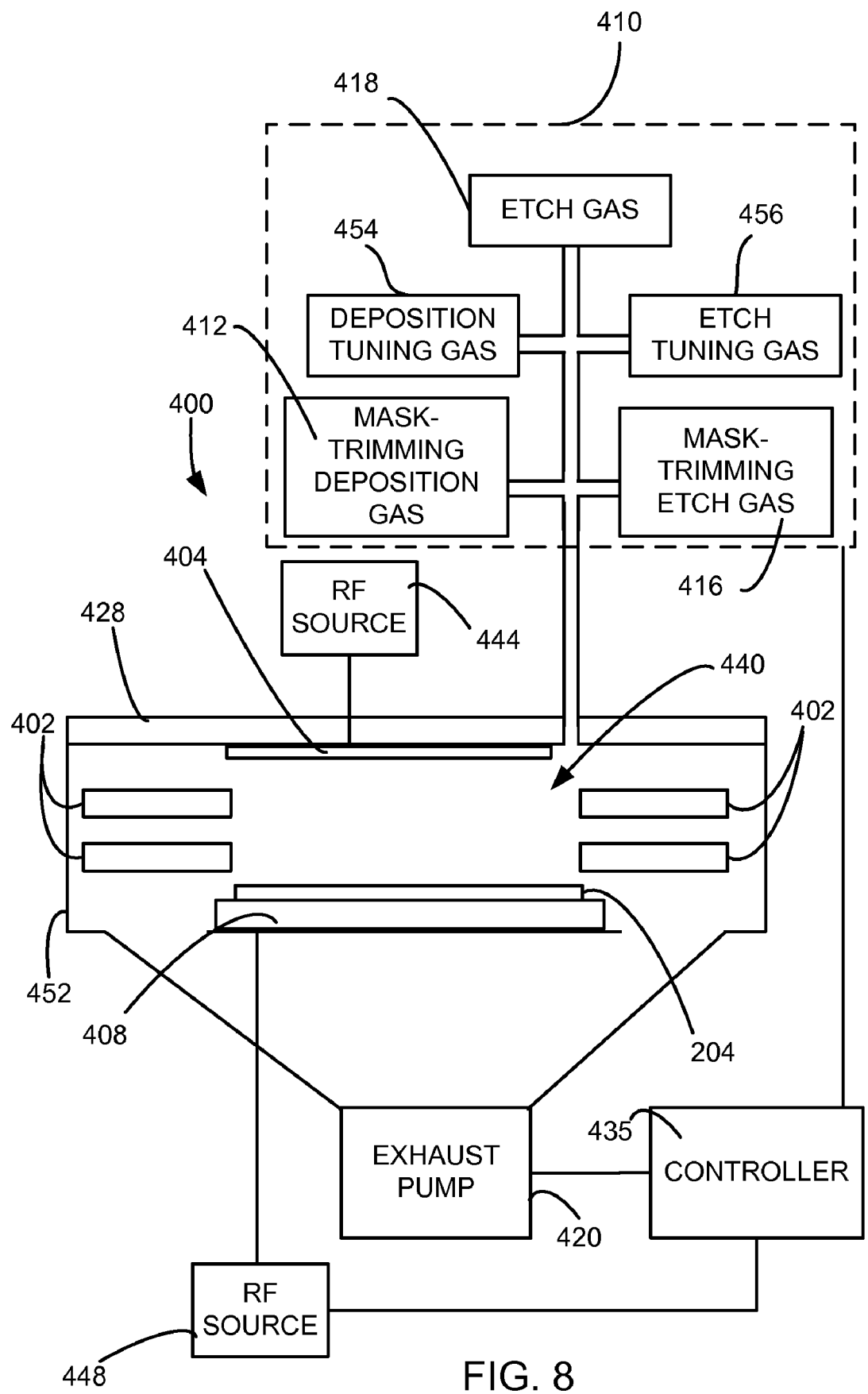
FIG. 8 is a schematic view of a plasma processing chamber that may be used in practicing the invention.

FIG. 8 is a schematic view of a processing chamber 400 that may be used for selectively trimming the mask, including depositing a deposition layer and selectively etching the deposition layer and the mask. The plasma processing chamber 400 comprises confinement rings 402, an upper electrode 404, a lower electrode 408, a gas source 410 connected through a gas inlet, and an exhaust pump 420 connected to a gas outlet. The gas source 410 comprises a mask-trimming deposition gas source 412 and a mask-trimming etch gas source 416. The gas source 410 may also comprise a deposition tuning gas source 454 for controlling the uniformity the mask-trimming deposition process, and, optionally, an etch tuning gas source 456 for controlling the uniformity in the mask-trimming etch process. Preferably, the processing chamber 400 is able to etch a dielectric layer. More preferably, the processing chamber 400 can also strip the mask (and ARL) such that mask-trimming, dielectric etch, and mask-stripping are done in situ. Thus, the gas source 410 may comprise additional gas sources, such as an etching gas source 418 for the dielectric layer, and a gas source for mask stripping (not shown).

Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 2 MHz power source, and a 60 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 27 MHz, 2 MHz, and 60 MHz power sources make up the second RF power source 448 connected to the lower electrode, and the upper electrode is grounded. A controller 435 is controllably connected to the RF sources 444, 448, exhaust pump 420, and the gas source 410. The DFC System would be used when the layer to be etched 208 is a dielectric layer, such as silicon oxide or organo silicate glass. The controller 435 controls the RF sources 444, 448, exhaust pump 420, the mask-trimming deposition gas source 412, mask-trimming tech gas source 416, and deposition tuning gas source 454, so as to alternately perform the mask-trimming deposition and mask-trimming etching as two phases of each cycle of a plurality of cycles.

Figure 9A:
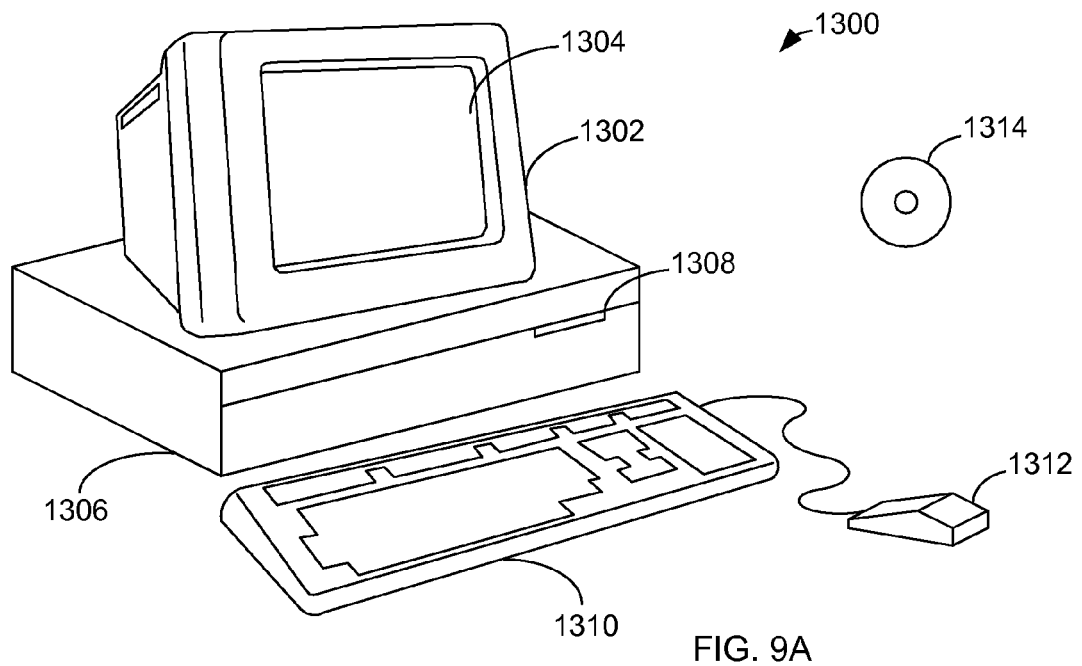
FIGS. 9A-B illustrate a computer system, which is suitable for implementing a controller used in embodiments of the present invention.
Figure 9B:
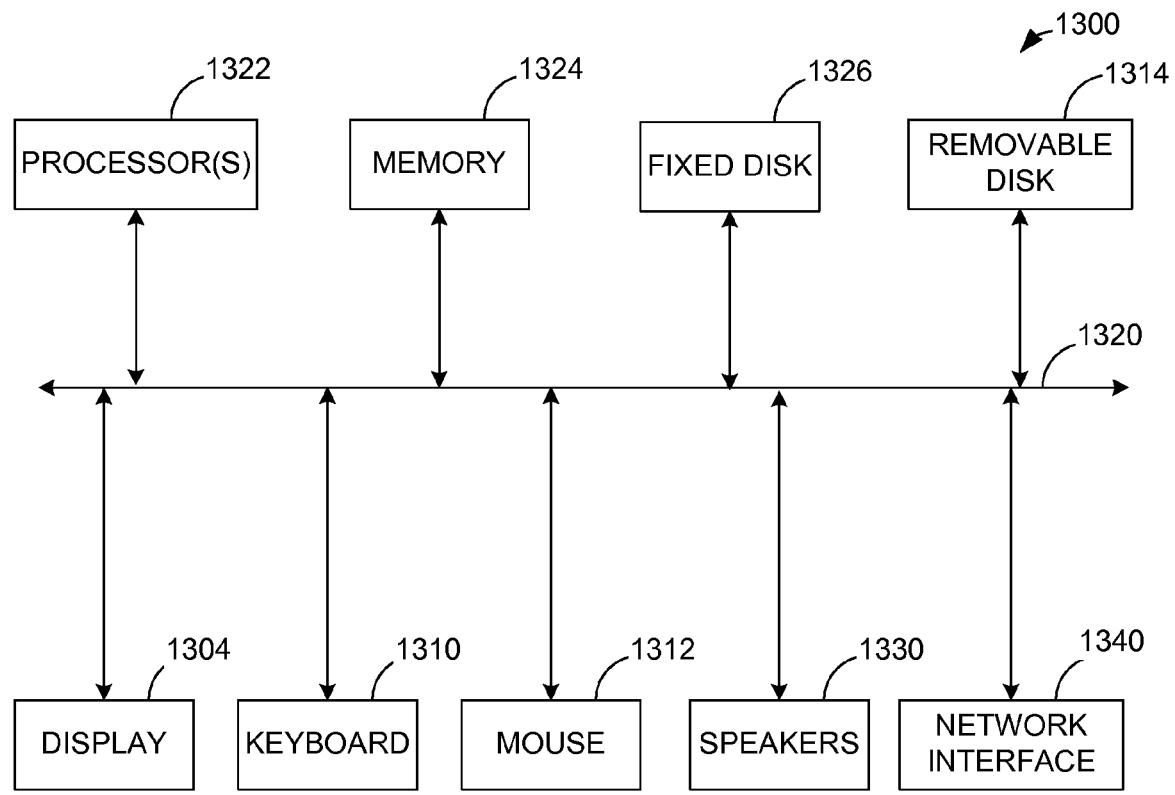

FIGS. 9A and 9B illustrate a computer system 1300, which is suitable for implementing a controller 435 used in embodiments of the present invention. FIG. 9A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 9B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 may optionally be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A multiple cycle two phase process is used to trim the mask (step 108 in FIG. 1) in which the sidewalls of the mask features in isolated areas (large mask features) are selectively trimmed with respect to dense areas (small mask features). In accordance with one embodiment of the present invention, where the mask is a photoresist, the deposition phase provides a deposition gas containing a hydrocarbon component, preferably $C_2H_4$. An example of a deposition in the deposition phase (step 304) provides a flow of 100-500 sccm $C_2H_4$, 100-500 sccm $N_2$, and 10-200 sccm Ar tuning gas. Ar tuning gas is selectively provided to the edge portion of the wafer to control the uniformity of the deposition process as the deposition phase generally deposits more at the edge of the wafer than the center. The pressure is set to 350-750 mTorr. The substrate is maintained at a temperature of 0-60° C., for example, at about 20° C. The second RF source 448 provides 200-400 Watts at a frequency of 60 MHz. In other embodiments, the second FR source 448 may provide 100-500 Watts at a frequency of 2 MHz, or 100-500 Watts at a frequency of 27 MHz, depending on the wafer and application. In accordance with one preferred embodiment, the deposition phase provides to the chamber a flow of 500 sccm $C_2H_4$, 150 sccm $N_2$, and 150 sccm Ar tuning gas, with a pressure of 740 mTorr and power of 200 Watts at a frequency of 60 MHz. In accordance with another preferred embodiment, the deposition phase provides a flow of 500 sccm $C_2H_4$, 150 sccm $N_2$, and 150 sccm Ar tuning gas, with a pressure of 740 mTorr and power of 400 Watts at a frequency of 60 MHz.

Alternatively, the hydrocarbon containing gas may include $CH_4$. In each deposition phase, after the hydrocarbon-containing deposition gas is introduced into the chamber, a deposition plasma is formed therefrom, as described above, to deposit the deposition layer. The flow of the deposition gas is stopped such that the deposition layer has a desired thickness. The thickness of the deposition layer may be controlled by the time period of the deposition phase for a given set the parameters such as gas flow rate, pressure, and the RF power.

An example of the selective etch phase (step 308) provides an $O_2$ containing gas, such as 100-1000 sccm $O_2$. In this example, $O_2$ is the only gas provided during the selective etch phase without tuning gas. It should be noted that the present invention is not limited to specific use of the tuning gas. In general, tuning gas is used to dilute the etch or deposition chemistry. For example, if an etch process is more dominant at the center portion, then tuning gas is provided at the center portion, and if an etch process is more dominant at the edge portion, then tuning gas is provided at the edge portion. Ar tuning gas may be used for deposition processes, and $O_2$ tuning gas may be used for etching processes. Both tuning gasses can be provided at the edge or center portion depending on the process and chemistry. A pressure of 350-750 mTorr is provided to the chamber. The second RF source 448 provides 200-400 Watts at a frequency of 60 MHz. In other embodiments, the second FR source 448 may provide 100-500 Watts at a frequency of 2 MHz, or 100-500 Watts at a frequency of 27 MHz, depending on the wafer and application. For example, in accordance with one preferred embodiment, the selective etch phase provides to the chamber a flow of 750 sccm $O_2$, a pressure of 740 mTorr, and a power of 200 Watts at a frequency of 60 MHz. In accordance with another preferred embodiment, the selective etch phase provides to the chamber a flow of 750 sccm $O_2$, a pressure of 740 mTorr, and a power of 400 Watts at a frequency of 60 MHz. In accordance with yet another preferred embodiment, the selective etch phase provides to the chamber a flow of 200 sccm $O_2$, a pressure of 380 mTorr, and a power of 200 Watts at a frequency of 60 MHz.

In other embodiments, each cycle may further include additional deposition and/or profile shaping phases. In each selective etch phase, after the $O_2$-containing etch gas is introduced into the chamber, a plasma is formed therefrom, as described above, to selectively trim the mask by selectively etch the deposition layer and the mask. The flow of the $O_2$-containing etch gas is stopped such that the deposition layer is removed and the mask features have a desired trim for the cycle. The amount of the trim may be controlled by the time period of the selective etch phase for a given set the parameters such as gas flow rate, pressure, and the RF power. In general, the longer the deposition phase, the longer the selective etch phase.

An example of a dielectric layer 208 to be etched may be a conventional etch layer, such as SiN, SiC, an oxide, or low-k dielectric. A conventional etch recipe may be used to etch the layer to be etched.

To strip the mask and the ARL (step 116) an oxygen ashing may be used.

Selectively trimming the mask by combining the deposition phase and the selective etch phase enables the control of CD bias between the isolated areas (large features) and the dense areas (small features) in the subsequent etch of the dielectric layer. The deposition-selective etch cycle can be repeated as many times as desired to obtain the ideal trim of the mask to realize the target CD of the dielectric layer.

While this invention has been described in terms of several preferred embodiments, there are alterations, modifications, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching a dielectric layer, the method comprising:
   forming a patterned mask with mask features over a dielectric layer, the mask having isolated areas and dense areas of the mask features;
   trimming the mask comprising a plurality of cycles, each cycle comprising:
      depositing a deposition layer; and
      selectively etching the deposition layer and the patterned mask, wherein the selective etching selectively trims the isolated areas of the mask with respect to the dense areas of the mask; and
   etching the dielectric layer using the trimmed mask.

2. The method as recited in claim 1, wherein in each depositing, a thickness of the deposition layer deposited on a top of the mask and a thickness of the deposition layer deposited on a bottom of the mask features are greater than a thickness of the deposition layer deposited on a sidewall of the mask.

3. The method as recited in claim 2, wherein in each depositing, a thickness of the deposition layer deposited on a sidewall of the mask in the isolated areas is greater than a thickness of the deposition layer that deposited in a dense area.

4. The method as recited in claim 1, wherein in each selectively etching, the sidewall of the mask in the isolated areas is etched back after the deposition layer deposited thereon is removed.

5. The method as recited in claim 4, wherein in each selectively etching, the deposition layer on the bottom of the mask features is removed without etching the dielectric layer thereunder.

6. The method as recited in claim 1, wherein in each selectively etching, the deposition layer deposited on the bottom of the mask features and on the sidewall of the mask is substantially removed without etching the dielectric layer or the mask thereunder in the dense areas.

7. The method as recited in claim 1, wherein an antireflective layer (ARL) is provided between the patterned mask and the dielectric layer, and wherein in each selectively etching, the deposition layer on the bottom of the mask features is removed without etching the ARL thereunder.

8. The method as recited in claim 7, wherein in each selectively etching, the deposition layer on the bottom of the mask features and on the sidewall of the mask is substantially removed without etching the ARL on the bottom of the mask feature and without etching the sidewall of the mask feature in the dense areas.

9. The method as recited in claim 1, wherein the patterned mask is a photoresist mask.

10. The method as recited in claim 9, wherein in each depositing comprises:
    providing a deposition gas comprising a hydrocarbon component;
    forming a plasma from the deposition gas; and
    stopping the flow of the deposition gas.

11. The method as recited in claim 10, wherein the deposition gas comprises $C_2H_4$.

12. The method as recited in claim 11, wherein each depositing further comprises providing a tuning gas comprising Ar.

13. The method as recited in claim 9, wherein each selectively etching comprises:
    providing an etch gas comprising $O_2$;
    forming a plasma from the etch gas; and
    stopping the flow of the etch gas.

14. The method as recited in claim 1, wherein the trimming comprises at least three cycles.

15. The method as recited in claim 14, wherein the trimming comprises four to five cycles.

16. An apparatus for etching a dielectric layer formed below a patterned mask with mask features, the mask having and isolated areas and dense areas of the mask features, the apparatus comprising:
    a plasma processing chamber, comprising:
       a chamber wall forming a plasma processing chamber enclosure;
       a substrate support for supporting a substrate within the plasma processing chamber enclosure;
       a pressure regulator for regulating the pressure in the plasma processing chamber enclosure;
       at least one electrode for providing power to the plasma processing chamber enclosure for sustaining a plasma;
       a gas inlet for providing gas into the plasma processing chamber enclosure; and
       a gas outlet for exhausting gas from the plasma processing chamber enclosure;
    a gas source in fluid connection with the gas inlet, comprising;
       a mask-trimming deposition gas source;
       a mask-trimming etch gas source; and
       a dielectric layer etch gas source;
    a controller controllably connected to the gas source and the at least one electrode, comprising:
       at least one processor; and
       non-transitory computer readable media comprising:
          computer readable code for trimming the mask comprising a plurality of cycles, wherein computer readable code for each cycle comprising:
             computer readable code for providing a deposition gas from the mask-trimming deposition gas source to form a deposition layer;
             computer readable code for generating a deposition plasma from the deposition gas;
             computer readable code for stopping the deposition gas from the mask-trimming deposition gas source;
             computer readable code for providing a mask-trimming etch gas from the mask-trimming etch gas source;
             computer readable code for generating an etch plasma from the mask-trimming etch gas source, the etch plasma selectively etching the deposition layer and the patterned mask, wherein the selective etching selectively trims the isolated areas with respect to the dense areas;
computer readable code for stopping the mask-trimming etch gas from the mask-trimming etch gas source;

computer readable code for etching the dielectric layer using the trimmed mask; and
computer readable code for removing the mask.

* * * * *